(12) United States Patent
Tichauer

(10) Patent No.: US 6,479,846 B2
(45) Date of Patent: *Nov. 12, 2002

(54) METAL OXIDE SEMICONDUCTOR FIELD EFFECT TRANSISTOR HAVING A RELATIVELY HIGH DOPED REGION IN THE CHANNEL FOR IMPROVED LINEARITY

(75) Inventor: Larry M. Tichauer, La Palma, CA (US)

(73) Assignee: Ophir RF, Inc., Los Angeles, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,389

(22) Filed: Mar. 22, 2000

(65) Prior Publication Data

US 2002/0125509 A1 Sep. 12, 2002

(51) Int. Cl.⁷ .................. H01L 29/76; H01L 21/336
(52) U.S. Cl. .................. 257/219; 257/288; 257/402; 438/289
(58) Field of Search .................. 257/288, 401–402, 257/219–221, 344, 341, 350, 285, 345, 404, 408; 435/217, 289

(56) References Cited

U.S. PATENT DOCUMENTS

| 4,101,921 A | 7/1978 | Shimada et al. ............. 257/326 |
| 4,132,998 A | 1/1979 | Dingwall ..................... 257/339 |
| 4,151,538 A | 4/1979 | Polinsky et al. ............. 257/326 |
| 4,198,252 A | 4/1980 | Hsu ............................. 438/287 |
| 4,353,083 A | 10/1982 | Trudel et al. ................ 438/326 |
| 4,395,725 A | 7/1983 | Parekh ........................ 257/404 |
| 4,467,452 A | 8/1984 | Saito et al. .................. 365/184 |
| 4,600,933 A | 7/1986 | Richman ..................... 257/391 |
| 4,984,042 A | 1/1991 | Pfiester et al. ............... 257/344 |
| 5,185,279 A | 2/1993 | Ushiku ........................ 438/290 |
| 5,244,823 A | 9/1993 | Adan ........................... 438/291 |
| 5,401,994 A | 3/1995 | Adan ........................... 257/335 |
| 5,432,366 A | 7/1995 | Banerjee et al. ............. 257/327 |

(List continued on next page.)

FOREIGN PATENT DOCUMENTS

| JP | 56-83973 | 7/1981 |
| JP | 61-276266 | 12/1986 |
| JP | 62-101074 | 5/1987 |
| JP | 1-28960 | 1/1989 |
| JP | 4-154174 | 5/1992 |
| JP | 5-226649 | 9/1993 |
| JP | 5-335565 | 12/1993 |

OTHER PUBLICATIONS

IBM Technical Disclosure Bulletin, vol. 14, No. 4, Sep. 1971, pp. 1279–1280.

(List continued on next page.)

*Primary Examiner*—Olik Chaudhuri
*Assistant Examiner*—Dilinh Nguyen
(74) *Attorney, Agent, or Firm*—Blakely, Sokoloff, Taylor & Zafman LLP

(57) ABSTRACT

A field effect transistor is disclosed having a relatively high doped region (of the same type dopant as the channel) to reduce the change in the depletion region within the channel with changes in the drain voltage (Vd). Changes in the drain current (Id) with changes in the drain voltage (Vd) is a cause of non-linearity for traditional MOSFET. Because of the additional higher doped region provided in the channel, the depletion region within the higher doped region changes less with changes in the drain voltage (Vd). The higher doped region is situated near the top of the channel, where most of the drain current flows. Thus, the higher doped region dominates the drain current through the device. Since the drain current is less susceptible to changes in drain voltage (Vd), a more linear device results.

19 Claims, 4 Drawing Sheets

U.S. PATENT DOCUMENTS

| | | | |
|---|---|---|---|
| 5,548,148 A | 8/1996 | Bindal | 257/335 |
| 5,622,880 A | 4/1997 | Burr et al. | 438/194 |
| 5,635,749 A | 6/1997 | Hong | 257/402 |
| 5,719,422 A | 2/1998 | Burr et al. | 257/336 |
| 5,739,569 A | 4/1998 | Chen | 257/321 |
| 5,753,958 A | 5/1998 | Burr et al. | 257/392 |
| 6,069,043 A * | 5/2000 | Floyd et al. | 438/270 |
| 6,121,666 A | 9/2000 | Burr | 257/408 |
| 6,127,886 A * | 10/2000 | Khabbaz et al. | 330/51 |
| 6,146,953 A * | 11/2000 | Lee et al. | 438/289 |

OTHER PUBLICATIONS

Treshold Voltage Characteristics of Double–Boron–Implanted Enhancement–Mode MOSFETs, by P.P. Wang et al., IBM Journal of Research and Development, vol. 19, No. 6, pp. 530–538, Nov. 1975.

Threshold Voltage Shift of MOS Transistors by Ion Implantation, Electronic Engineering, Jan. 1976, pp. 41–43.

* cited by examiner

TRADITIONAL MOSFET

IMPROVED FET

METAL OXIDE SEMICONDUCTOR FIELD EFFECT TRANSISTOR HAVING A RELATIVELY HIGH DOPED REGION IN THE CHANNEL FOR IMPROVED LINEARITY

FIELD OF THE INVENTION

This invention generally relates to semiconductor devices, and specifically, to a metal oxide semiconductor field effect transistor (MOSFET) having a relatively high doped region in the channel for improved linearity.

BACKGROUND OF THE INVENTION

Linearity in radio frequency (RF)/microwave power amplifiers is an important characteristic in the design of these devices. Poor linearity in power amplifiers can have many adverse effects. For instance, poor linearity can result in harmonic, intermodulation, and signal compression distortions, to name a few. Thus, designers of power amplifiers continue to develop new techniques for improving the linear characteristic of power amplifiers.

Traditionally, two types of field effect transistors have been used for RF/microwave power amplification. These are the metal-oxide semiconductor field effect transistor (MOSFET) and the gallium-arsenide field effect transistor (GaAs FET). MOSFETs are desirable because their manufacturing process is less complex and inexpensive. However, they have poorer linear characteristics. GaAs FETs, on the other hand, are more frequently employed for RF/microwave power amplification applications due to their improved linearity characteristic over MOSFETs. However, their manufacturing process is more complex and expensive.

FIG. 1A illustrates a side sectional view of a traditional MOSFET 100 used to illustrate their non-linearity characteristic. For linearity purpose, the only parameter that should vary the drain current (Id) is the gate voltage (+Vg). If other parameters vary the drain current, a non-linear drain current (Id) can result in response to an input voltage (+Vg) at the gate. One such parameter is the drain voltage (+Vd). If the drain voltage (+Vd) changes the drain current, then a non-linear output results in response to an input voltage (+Vg) at the gate. This characteristic of the traditional MOSFET 100 will be explained in more detail with reference to FIG. 1A.

As shown in FIG. 1A, the traditional MOSFET 100 comprises a semiconductor substrate 102 having a relatively light p-type doping (p−), a drain region 104 having a relatively high n-doped region (n+) 104a and a relatively light n-doped region (n−) 104b, and a source region 106 having a relatively high n-doped region (n+) 106. The source region 106 may include a relatively high p-doped region (p+) 110 which provides a body contact to the p-channel for grounding and other purposes. A current conduction channel is 112 is formed between the drain 104 and source 106 regions. The traditional MOSFET 100 further includes a gate electrode 114 deposited on the p-channel that on the substrate 102.

As typical of MOSFETs, a depletion region is formed within the channel 112 which affects the current conduction characteristic of the channel 112. Assuming the gate voltage (+Vg) applied to the gate electrode 114 remains constant, the depletion region within the channel varies as a function of the drain voltage (+Vd). The undepleted region within the channel is defined in FIG. 1A as the length under gate (Lug). As FIG. 1A illustrates, holding the gate voltage (+Vg) constant and adjusting the drain voltage to Vd1, the Lug1 is relatively small (corresponding to a smaller series resistance) which results in a relatively larger drain current. If the drain voltage is changed to Vd2 with the gate voltage (+Vg) held constant, the Lug2 is relatively large (corresponding to a larger series resistance), which results in a relatively smaller drain current. Thus, this shows that the traditional MOSFET 100 behaves in a non-linear fashion since the drain voltage (+Vd) can substantially vary the depletion region.

FIG. 1B illustrates a schematic diagram of an equivalent circuit for the traditional MOSFET 100. From an equivalent circuit standpoint, the MOSFET 100 comprises a drain-to-gate capacitance Cdg that varies as a function of the gate voltage (Vdg), a gate-to-source capacitance Cgs which is substantially constant, and a drain-to-source capacitance Cds which is also substantially constant. The equivalent circuit MOSFET 100 further includes a current source 120 representing the drain current and a resistance of the channel (termed herein as resistance-under-gate (Rug)). It is noted that because of the non-linearity of the traditional MOSFET 100 as explained above, the channel resistance Rug varies as a function of the drain voltage (Vd), the gate-to-source voltage (Vgs), and the temperature T. Thus, for the sake of linearity, it would be preferable for a MOSFET 100 to vary substantially only with variations in the gate-to-source voltage (Vgs) when the device is in saturation.

FIG. 1C illustrates the drain current (Id) versus drain voltage (Vd) for the traditional MOSFET 100. As the curves illustrates, when the traditional MOSFET 100 reaches the saturation region, there is still a positive slope of the drain current (Id) with increases in the drain voltage (Vd). Because of this, the traditional MOSFET 100 does not have the linearity that many power amplifier designers desire.

Thus, there is a need for a MOSFET type semiconductor device that provides improved linearity over traditional MOSFET devices.

SUMMARY OF THE INVENTION

A general concept of the invention is to include a relatively higher doped region (of the same type dopant as the channel) to reduce the change in the depletion region within the channel with changes in the drain voltage (Vd). As previously discussed, changes in the drain current (Id) with changes in the drain voltage (Vd) is a cause of non-linearity for traditional MOSFET. Because of the additional higher doped region provided in the channel, the depletion region within the higher doped region changes less with changes in the drain voltage (Vd). The higher doped region is situated at the top of the channel, where most of the drain current flows. Thus, the higher doped region contains the drain-to-source current. Any performance dependent depletion modulation in the path of the current will be minimally effected since the change in channel resistance will be minimized. This results in a reduced sensitivity of the drain current (Id) to the drain voltage (Vd). Since the drain current is less susceptible to changes with changes in drain voltage (Vd), a more linear device results. The MOSFET device may be incorporated as an individual device or in an integrated circuit.

A more specific exemplary embodiment includes a field effect transistor, comprising a substrate, a drain region formed within the substrate, a source region formed within the substrate, a current conduction channel formed within the substrate between the drain and source regions, a gate electrode formed over an oxide which is on the substrate above the channel, and a doped region formed within the channel to reduce an effect of a drain-to-source voltage has on a drain current when the field effect transistor is in saturation.

Another aspect of the invention is an amplifier that uses the field effect transistor of the invention. Specifically, the amplifier comprises a field effect transistor having a doped region formed within a channel to reduce an effect of a drain-to-source voltage has on a drain current when the field effect transistor is in saturation, an input impedance matching circuit coupled to a gate terminal of the field effect transistor, and an output impedance matching circuit coupled to a drain terminal of the field effect transistor.

A further aspect of the invention includes a field effect transistor comprising a substrate, a drain region formed within the substrate, a source region formed within the substrate, a doped channel formed within the substrate between the drain and source regions; a gate electrode formed over the substrate above the channel, and a doped region formed within the doped channel, wherein a dopant concentration of the doped region is greater than a dopant concentration of the channel.

Other aspects of the invention will become apparent in view of the following detailed discussion of the invention.

DETAILED DESCRIPTION OF THE INVENTION

A general concept of the invention is to include a relatively higher doped region (of the same type dopant as the channel) to reduce the change in the depletion region within the channel with changes in the drain voltage (Vd). As previously discussed, changes in the drain current (Id) with changes in the drain voltage (Vd) is a cause of non-linearity for traditional MOSFET. Because of the newly-added higher doped region provided in the channel, the depletion region within the higher doped region changes less with changes in the drain voltage (Vd). The higher doped region is situated at the top of the channel, where most of the drain current flows. Thus, the drain-to-source current flows through the higher doped region which dominates where the drain current through the device is located. Since the drain current is less susceptible to changes with changes in drain voltage (Vd), a more linear device results.

Figure 1A:
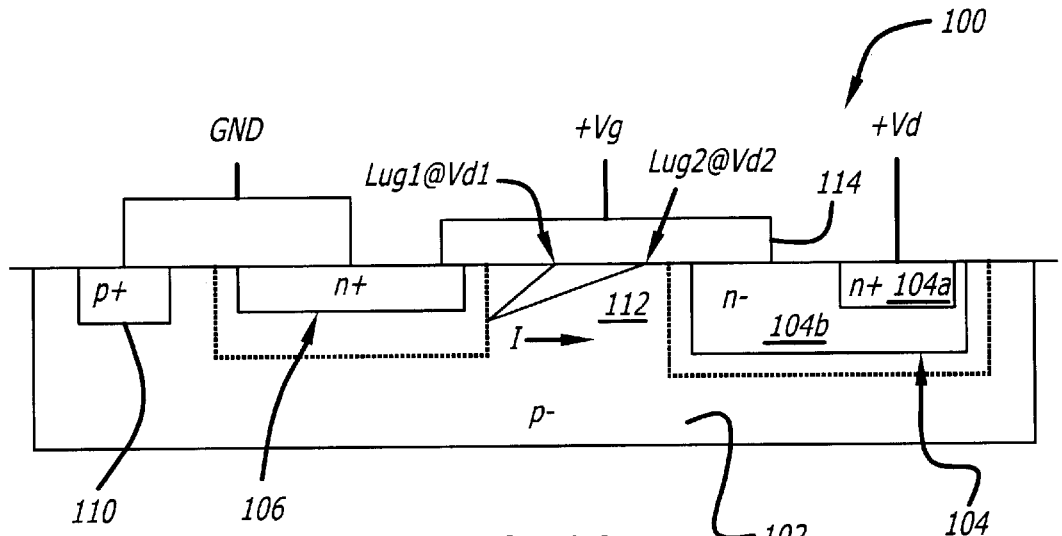
FIG. 1A illustrates a side sectional view of a traditional MOSFET used to illustrate their non-linearity characteristic.
Figure 1B:
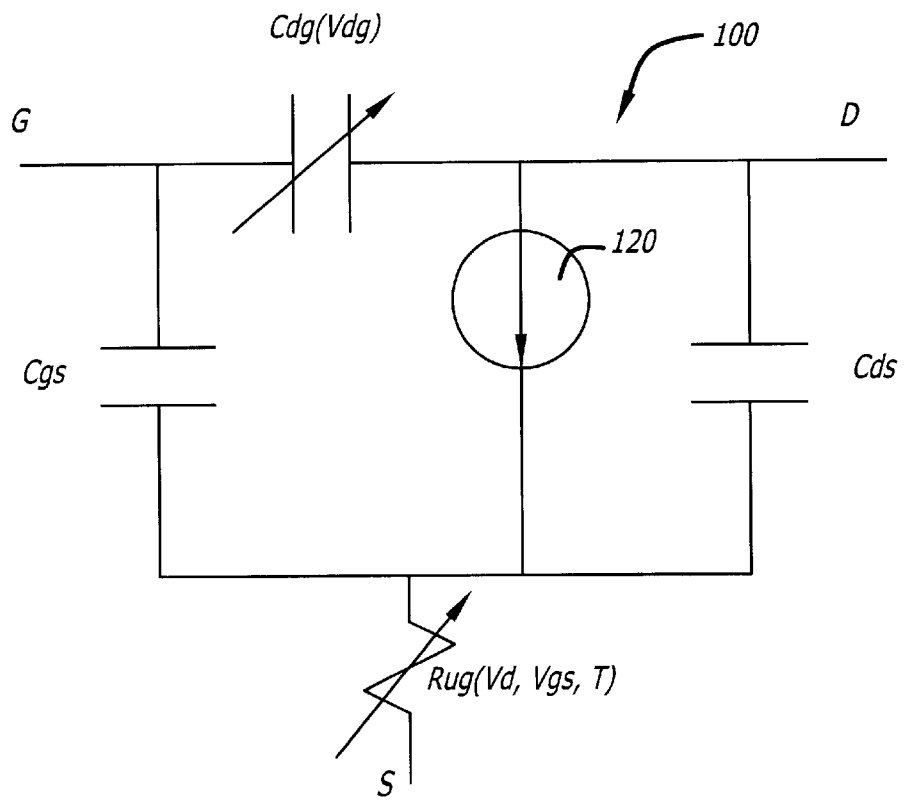
FIG. 1B illustrates a schematic diagram of an equivalent circuit for the traditional MOSFET.
Figure 1C:
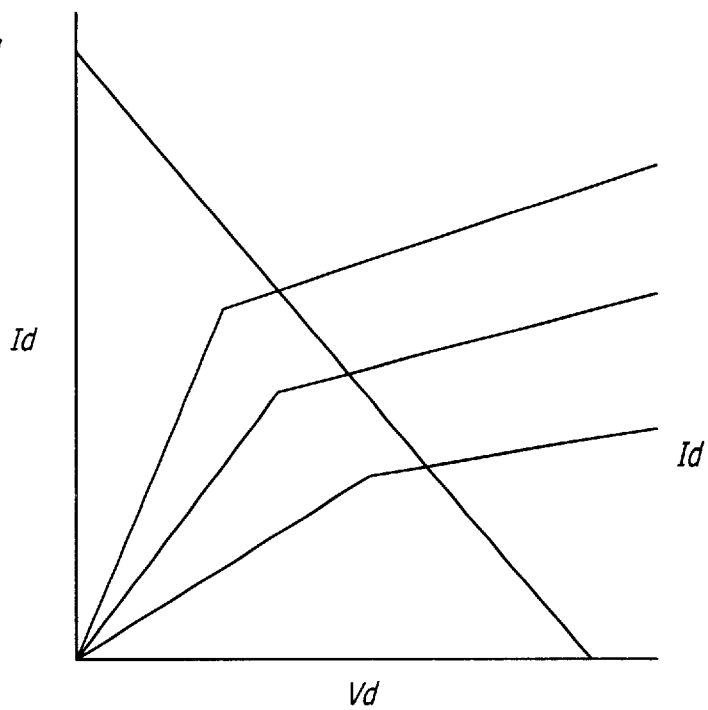
FIG. 1C illustrates the drain current (Id) versus drain voltage (Vd) for the traditional MOSFET.
Figure 2C:
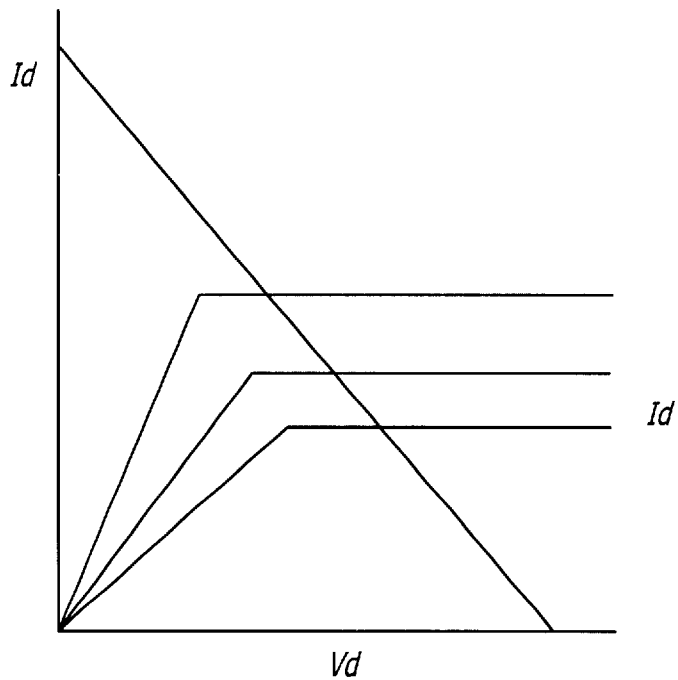
FIG. 2C illustrates the drain current (Id) versus drain voltage (Vd) for the FET of the invention.
Figure 2A:
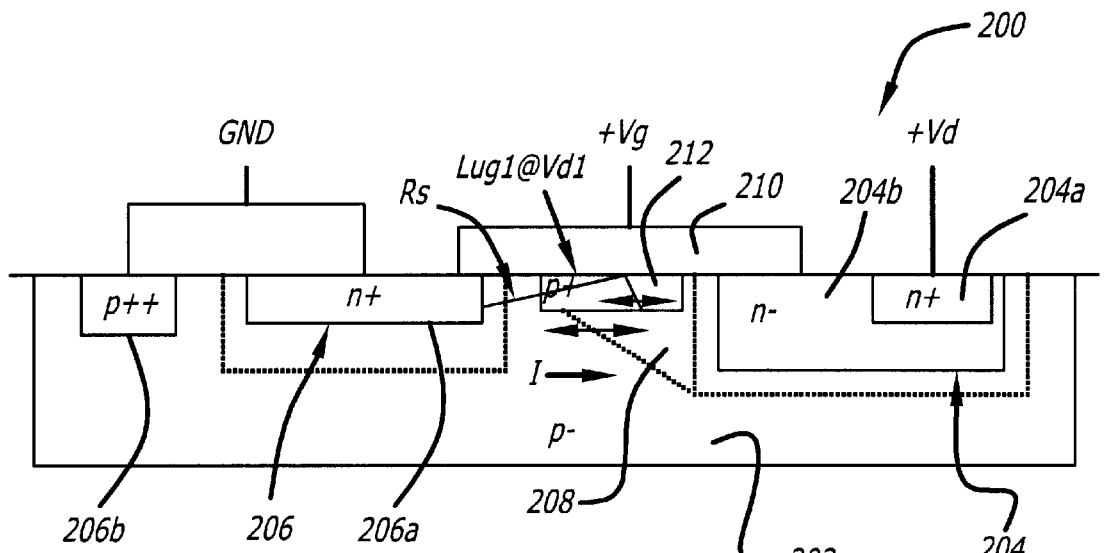
FIG. 2A illustrates a side sectional view of an exemplary field effect transistor (FET) in accordance with the invention.

FIG. 2A illustrates a side sectional view of an exemplary field effect transistor (FET) 200 in accordance with the invention. The FET 200 comprises a substrate 202, a drain region 204, and a source region 206. In the exemplary FET 200, the substrate 202 is doped with a p-dopant (p−) and the source 204 and drain 206 regions are doped with an n-dopant. It shall be understood that the substrate could be doped with an n-dopant and the drain 204 and source 206 regions could be doped with p-dopant. In the preferred embodiment, the drain region 204 comprises a relatively high doped region (n+) 204a and a relatively low doped region (n−) 204b. The source region 206 preferably comprises a relatively high doped region (n+) 206a. A current conduction channel 208 is formed between the drain 204 and source 206 regions. The FET 200 further includes a gate electrode 210 formed on a dielectric (e.g. an oxide) which is, in turn, formed on the substrate 202 above the channel 208.

The source region 206 may also include a relatively high p-doped region (p++) 206b which provides a body contact to the p-channel. The body contact 206b is typically at a ground potential or other potential to prevent forward biasing of the channel to source junction. In a p-channel device, the body contact 206b is typically grounded or at a positive voltage as compared to the voltage of the p-channel. In an n-channel device, the body contact 206b is typically grounded or at a negative voltage as compared to the voltage of the n-channel.

To improve the linearization characteristic of the device, the FET 200 includes a relatively high doped region 212 (i.e. the doping of this region is higher than the doping of the substrate) within the channel 208. Because the exemplary FET 200 comprises a p-doped substrate (p−), the higher doped region 212 is doped with p-dopant (i.e. making it a p+ region). If, however, the FET 200 was formed on an n-doped substrate, then the relatively high doped region 212 would be doped with n-dopant. Additionally, the FET 200 may be formed on an insulating substrate. Because of the higher dopant level in the higher doped region 212, the depletion region within region 212 varies less than the depletion region elsewhere in the channel with changes in the drain voltage (Vd) when the device is in saturation. This feature of the FET 200 improves the linear characteristic of the device.

The gate voltage (+Vg) therefore dominates in the control of the drain current through the device. The reason being is that the drain current flows near the top of the substrate 202. The gate voltage (+Vg) induces a channel of electrons to be generated from the partial depletion region within the p+ region 212 to the source region 206a, thereby increasing the drain current. Since the p+ region 212 is situated at the top of the substrate 202, the amount of electrons induced in the p+region 212 by the gate voltage (+Vg) contains the flow of the drain current. Thus, the FET 200 has improved linear characteristic since changes in the resultant series resistance, Rug, under the gate is dominated by changes in gate voltage (Vg), with minimal effects from other parameters, including the drain voltage (Vd).

To improve the linear characteristic of the FET 200 even further, the p+ region 212 has a doping profile that increases as the source is approached. In effect, this increase in the doping profile of the p+region in the source direction requires the drain voltage (Vd) to increase disproportional to have the same effect on the depletion region, if the p+ region would otherwise have a uniform doping profile. As a result, the depletion region within the p+ region is further immune from changes in the drain voltage (Vd). This feature further improves the linear characteristic of the FET 200.

Figure 2B:
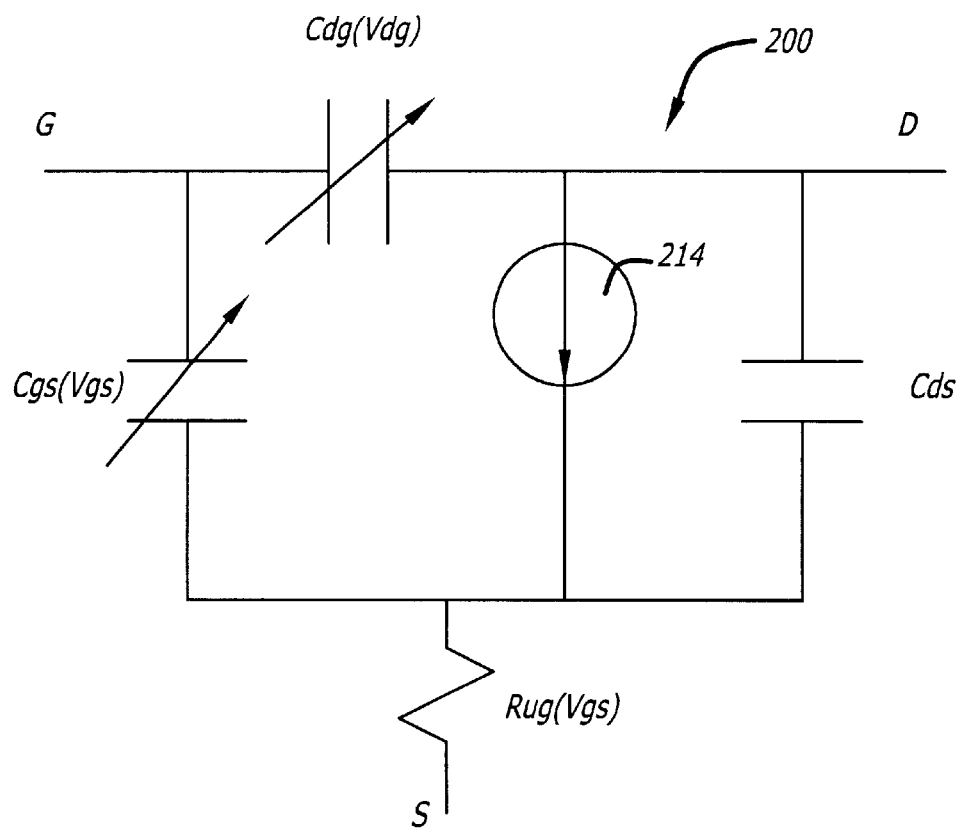
FIG. 2B illustrates a schematic diagram of an equivalent circuit for the FET in accordance with the invention.

FIG. 2B illustrates a schematic diagram of the equivalent circuit for the FET 200 in accordance with the invention. From an equivalent circuit standpoint, the FET 200 comprises a drain-to-gate capacitance Cdg that varies as a function of the gate-to-drain voltage (Vdg), a gate-to-source capacitance Cgs which varies as a function of the gate-to-source voltage (Vgs), and a drain-to-source capacitance Cds which is substantially constant. The equivalent circuit FET 200 further includes a current source 214 representing the drain current and a resistance of the channel (termed herein as resistance-under-gate (Rug)). It is noted that because the FET 200 is further immune from changes in the drain voltage (Vd), the channel resistance Rug varies substantially only as a function of the gate-to-source voltage (Vgs). Again, this feature improves the linear characteristic of the FET 200.

FIG. 2C illustrates the drain current (Id) versus drain voltage (Vd) for the FET 200 of the invention. As the curves illustrates, when the FET 200 reaches the saturation region, the drain current curves are substantially flat. That is, the drain current (Id) does not change much with changes in the drain voltage (Vd). Because of the improved linear characteristic of the FET 200, this device is particularly useful for power amplification applications.

Figure 3:
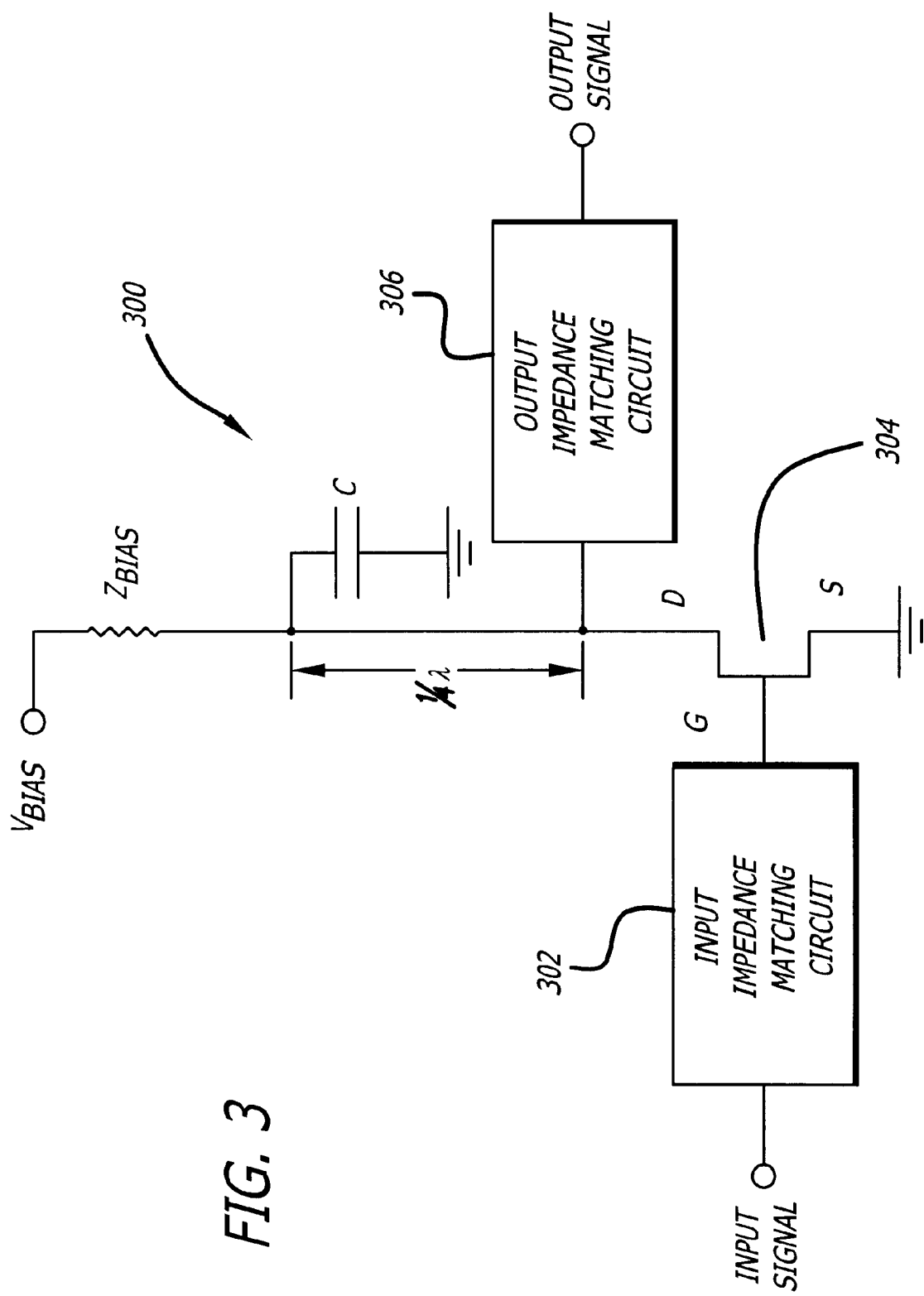
FIG. 3 illustrates a block/schematic diagram of an exemplary amplifier in accordance with the invention.

FIG. 3 illustrates a block/schematic diagram of an exemplary amplifier 300 in accordance with the invention. The amplifier 300 comprises an input impedance matching circuit 302, a FET 304 of the type described with regard to FET 200, and an output impedance matching circuit 306. The FET 304 may be biased by grounding its source (S) terminal and applying a bias voltage Vbias through a bias impedance Zbias to the drain (D) terminal of the device. A high RF impedance bias circuit, such as for example a quarter wavelength line with a shunting capacitor C is used to prevent a radio frequency (RF) signal from "leaking" out through the bias circuit. The input impedance matching circuit 302 substantially matches the characteristic impedance of an input transmission line to the impedance of the gate (G) of the FET 304. The output impedance matching circuit 306 substantially matches the characteristic impedance of an output transmission line to the impedance of the drain (D) of the FET 304. Because of the improved linear characteristic of the FET 304, the amplifier 300 likewise has improved linear properties.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A field effect transistor, comprising:
    a drain region;
    a source region;
    a current conduction channel formed between said drain and source regions, wherein said current conduction channel comprises a first doped region located centrally within and proximate an upper region of said channel, a second doped region situated between said first doped region and said drain region, and a third doped region located between said first doped region and said source region, and wherein a first doping concentration of said first doped region is substantially greater than a second and third doping concentrations respectively of said second and third doped regions, wherein said first, second and third doped regions are doped with the same polarity dopants, and further wherein a doping concentration within said first doped region increases towards said source region;
    a dielectric formed over said channel; and
    a gate electrode formed over said dielectric.

2. The field effect transistor of claim 1, wherein the first, second, and third doped regions are doped with p-type dopant.

3. The field effect transistor of claim 1, wherein the first, second, and third doped regions are doped with n-type dopant.

4. The field effect transistor of claim 1, wherein the drain region comprises fourth and fifth doped regions, and wherein a dopant concentration of said fourth doped region is greater than a dopant concentration of said fifth doped region.

5. The field effect transistor of claim 1, wherein the source region comprises a fourth doped region and a body contact, and wherein the dopant of said fourth doped region is of an opposite type as a dopant of said channel, and wherein the dopant of said body contact is of a same type as a dopant of said channel.

6. The field effect transistor of claim 5, wherein a dopant concentration of said body contact is greater than the dopant concentration of said channel.

7. An amplifier, comprising:
    a field effect transistor having a current conduction channel including a first doped region located centrally within and proximate an upper region of said channel, a second doped region situated between said first doped region and said drain region, and a third doped region located between said first doped region and said source region, and wherein a first doping concentration of said first doped region is substantially greater than a second and third doping concentrations respectively of said second and third doped regions, wherein said first, second and third doped regions are doped with the same polarity dopants, and further wherein the doping concentration within said first doped region increases towards a source region of said transistor;
    an input impedance matching circuit coupled to a gate terminal of said field effect transistor; and
    an output impedance matching circuit coupled to a drain terminal of said field effect transistor.

8. The amplifier of claim 7, wherein said field effect transistor comprises:
    a dielectric formed over said channel; and
    a gate electrode formed over said dielectric.

9. The amplifier of claim 8, wherein the drain region comprises fourth and fifth doped regions, and wherein a dopant concentration of said fourth doped region is greater than a dopant concentration of said fifth doped region.

10. The amplifier of claim 8, wherein the source region comprises a fourth doped region and a body contact, and wherein the dopant of said fourth doped region is of an opposite type as a dopant of said channel, and wherein said fifth doped region is of a same type as a dopant of said channel.

11. The amplifier of claim 10, wherein a dopant concentration of said body contact is greater than the dopant concentration of said substrate.

12. The amplifier of claim 7, wherein the first, second, and third doped regions are doped with p-type dopant.

13. The amplifier of claim 7, wherein the first, second, and third doped regions are doped with n-type dopant.

14. A field effect transistor, comprising:
    a drain region;
    a source region;
    a channel formed between said drain and source regions, wherein said channel comprises a first doped region located centrally within and proximate an upper region of said channel, a second doped region situated between said first doped region and said drain region, and a third doped region located between said first doped region and said source region, and wherein a first doping concentration of said first doped region is substantially greater than a second and third doping concentrations respectively of said second and third doped regions, wherein said first, second and third doped regions are doped with the same polarity dopants, and further wherein the dopant concentration within said first doped region increases toward said source region;

a dielectric formed over said channel; and a gate electrode formed over dielectric.

15. The field effect transistor of claim 14, wherein the first, second, and third doped regions are doped with p-type dopant.

16. The field effect transistor of claim 14, wherein the first, second, and third doped regions are doped with n-type dopant.

17. The field effect transistor of claim 14, wherein the drain region comprises fourth and fifth doped regions, and wherein a dopant concentration of said fourth doped region is greater than a dopant concentration of said fifth doped region.

18. The field effect transistor of claim 14, wherein the source region comprises a fourth doped region and a body contact, and wherein the dopant of said fourth doped region is of an opposite type as a dopant of said channel, and wherein the dopant of said body contact is of a same type as a dopant of said substrate.

19. The field effect transistor of claim 18, wherein a dopant concentration of said body contact is greater than the dopant concentration of said substrate.

* * * * *